United States Patent [19]
Sonoda

[11] 3,949,385
[45] Apr. 6, 1976

[54] D.C. STABLE SEMICONDUCTOR MEMORY CELL

[75] Inventor: George Sonoda, Poughkeepsie, N.Y.
[73] Assignee: IBM Corporation, Armonk, N.Y.
[22] Filed: Dec. 23, 1974
[21] Appl. No.: 535,464

[52] U.S. Cl. ......... 340/173 FF; 307/291; 340/173 R
[51] Int. Cl.² . G11C 7/00; G11C 8/00; G11C 11/40
[58] Field of Search .................. 340/173 R, 173 FF; 307/291, 279

[56] References Cited
UNITED STATES PATENTS
3,540,007   11/1970   Hodges ........................... 340/173 FF
3,550,097   12/1970   Reed .............................. 340/173 FF OTHER PUBLICATIONS
Baitinger et al., MOSFET Storage Cell, IBM Technical Disclosure Bulletin, Vol. 13, No. 10, 3/71, p. 3160, S1509 0037.
Pleshko, Field–Effect Memory Cell with Low Standby Power and High Switching Speed, IBM Technical Disclosure Bulletin, Vol. 8, NO. 12, 5/66, pp. 1838–1839.

Primary Examiner—Stuart N. Hecker
Attorney, Agent, or Firm—T. E. Galanthay

[57] ABSTRACT

Disclosed is a field effect transistor (FET) memory array in which each of the cells forming the array comprises four FET's. The first and second of the four FET devices are cross-coupled while the third and fourth FET devices form loads for the cross-coupled pair. D.C. stability is achieved by conditioning the load FET devices into partial conduction during the stand-by state of the memory cell.

18 Claims, 2 Drawing Figures

3,949,385

D.C. STABLE SEMICONDUCTOR MEMORY CELL

CROSS REFERENCES TO RELATED APPLICATIONS AND PATENTS

1. Spampinato et al U.S. Pat. No. 3,541,530 issued on Nov. 17, 1970, and assigned to the assignee of the present invention.
2. Askin et al application Ser. No. 535,875 filed Dec. 23, 1974, concurrently with the present application.

BACKGROUND OF THE INVENTION

1. Field of the Invention

This invention relates to a D.C. stable semiconductor memory array and more particularly to such an array in which each memory cell comprises four field effect transistors.

2. Description of the Prior Art

The above-mentioned Spampinato et al patent exemplifies the prior art in memory arrays having memory cells comprising four field effect transistors. Such four device cells have traditionally not been D.C. stable and therefore required periodic refreshing to prevent loss of the stored information. A number of different techniques for refreshing such non-D.C. stable memory cells were developed, however, they all lack the advantageous feature of D.C. stability as described in the present application.

SUMMARY OF THE INVENTION

Accordingly, it is a primary object of this invention to provide a D.C. stable storage cell with only four field effect transistors.

It is a further object of this invention to provide a memory array consisting of such cells;

It is a further object of this invention to provide three distinct levels of bias voltage to each of the memory cells.

In accordance with the present invention, a semiconductor memory array of four device FET cells is provided. Word lines and bit lines are arranged orthogonally in a known manner to permit accessing and sensing of information with an individual desired memory cell. Restoring means for equalizing or precharging the potential on a pair of bit lines is also provided. In addition to the foregoing, there is provided an array biasing means. In accordance with the present invention, the array bias means includes transistor means to provide a bit line and word line bias at a potential level intermediate between the full logical up and down levels.

The foregoing and other objects, features, and advantages of this invention will be apparent from the folowing more detailed description of a preferred embodiment of the invention as illustrated in the accompanying drawings.

DETAILED DESCRIPTION

Figure 1:
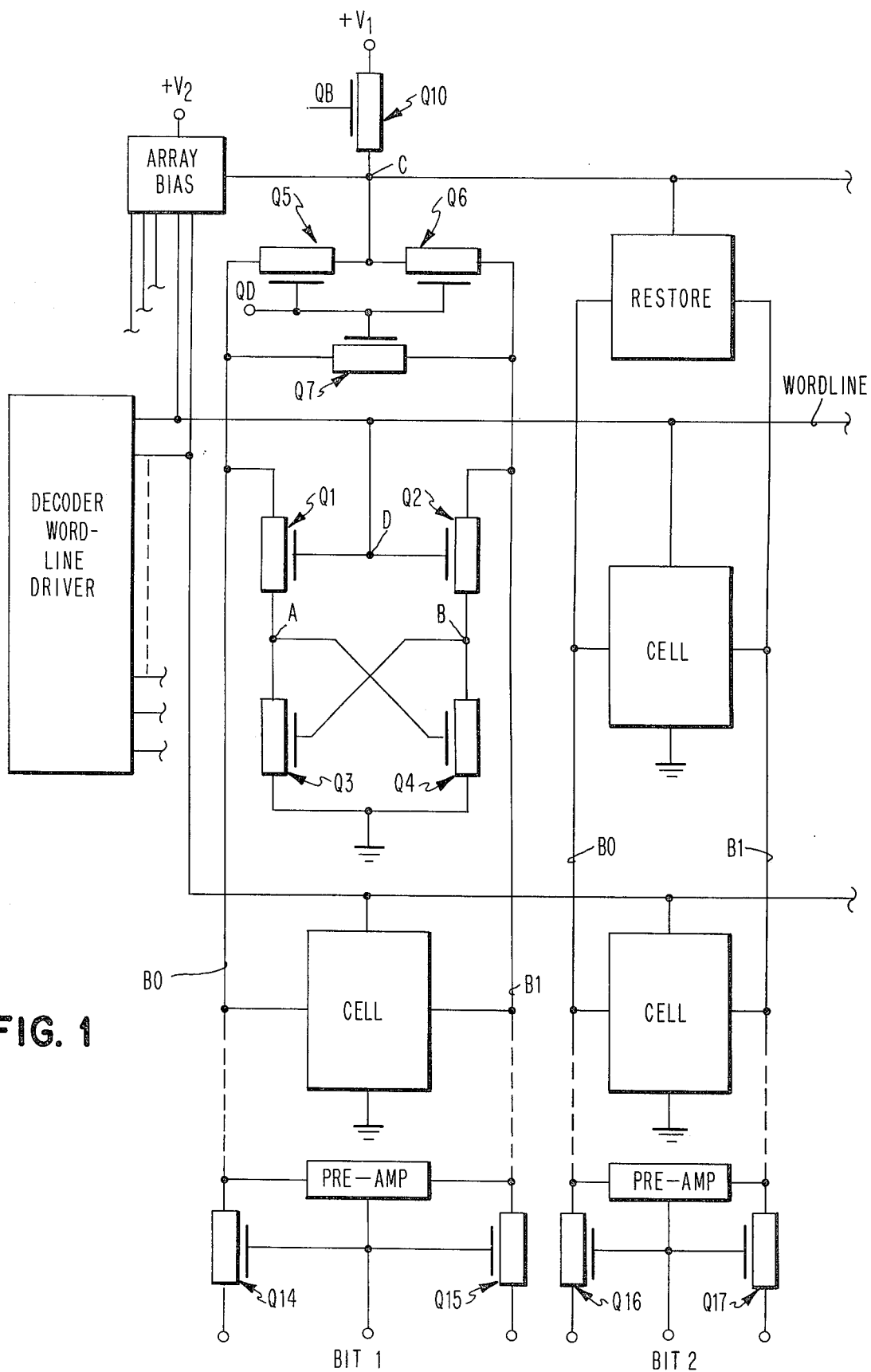
FIG. 1 is a schematic circuit diagram of the preferred embodiment.

Refer now to FIG. 1 for description of the circuit details. A matrix of four cells is shown for purposes of illustration. A typical cell includes four field effect transistors such as Q1, Q2, Q3, and Q4. Each of the field effect transistors have two gated electrodes and a gating electrode. Transistors Q3 annd Q4 have a gated and gating electrode of one respectively connected to a gating and gated electrode of the other forming a cross-coupled pair; the other of the gated electrodes of each of said transistors being connected to a fixed potential such as ground. Devices Q1 and Q2 are load devices connected in series between the internal cell nodes A and B and the associated bit line BO and B1, respectively. Three other cells are illustrated merely as block diagrams to complete the four cell matrix or array. Those skilled in the art will understand that in practice numerous such cells compose an array and the number illustrated here has been limited merely for ease of illustration.

The restoring means for equalizing or precharging the bit lines consists of transistors Q5, Q6, and Q7. The gating electrodes of each of said transistors is connected together and adapted to receive a pulse signal on terminal phase D. The gated electrodes of Q7 are connected in series between the two bit lines providing equalization of potential. Transistors Q5 and Q6 are connected in a series path with each other between the two bit lines and receive a potential at a common point between them for application equally to the two bit lines. The potential at this common point designated as node C will either be a full binary 1 or 0 level or at a third intermediate level during standby. The array bias circuit is connected between a third fixed potential +V2 (representing an intermediate potential of +2 to +3 volts) and/or nodes C and D. Thus, during standby, the cells are connected between a second fixed potential (ground representing a full logical down level) and a third intermediate potential. Isolation means within the array bias isolates all word lines from the array bias when one of the word lines is to be accessed. The internal circuit structure of the array bias circuit to provide an intermediate voltage between two fixed voltages is a matter of design, a specific example being found in the above mentioned co-pending application to Askin et al. Transistor Q10 has its gated electrodes connected in a series path between a first fixed potential +V1 and node C. In the N channel MOSFET technology assumed for the purposes of the present illustrative example, +V1 is typically +8.5 volts representing a full logical up level.

Each of the word lines is also connected to a decoder/word line driver permitting individual accessing of any one word line. Each of the bit lines is further connected to a gated electrode of a field effect transistor such as Q14, Q15, Q16, or Q17. The gating electrode of each of said transistors is connected to a bit decoder output terminal such as BIT 1, BIT 2, etc. The other of the gated electrodes of each of said transistors is connected to a data input or a sense amplifier depending on whether a write or read operation is desired. Lastly, a preamplifier is connected between the two bit lines so that in the read mode, the difference between the potential on lines BO and B1 is amplified prior to transmission to the sense amplifier.

Figure 2:
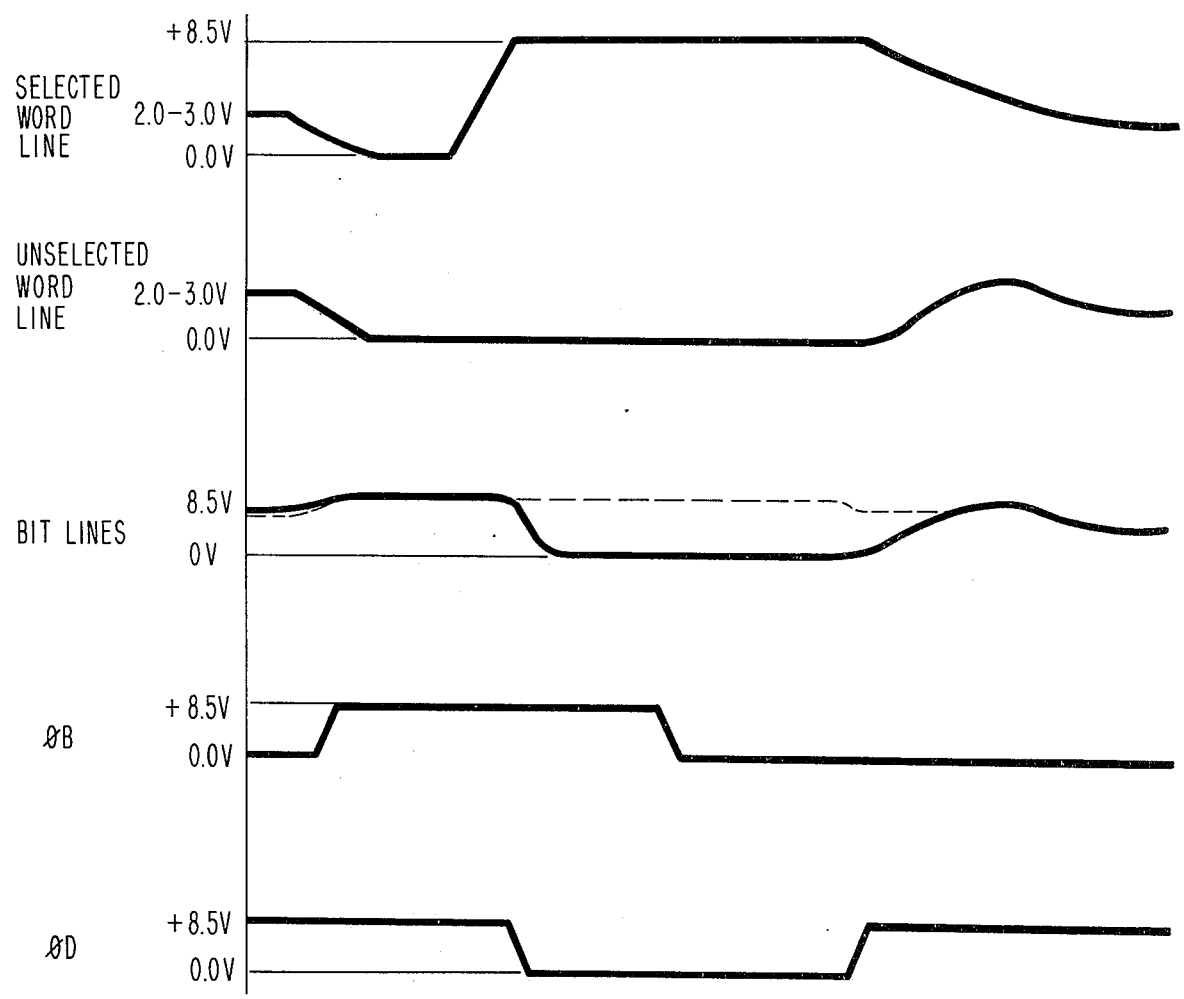
FIG. 2 is a series of waveform diagrams depicting the operation of the circuit of FIG. 1.

In operation, the array operates in a D.C. stable mode, in response to the application of various timing pulses to the various gating electrodes as illustrated in FIGS. 1 and 2. During standby, the array bias circuit applies an intermediate potential to either of nodes C or D, or as illustrated in FIG. 1 to both of them. This causes load devices Q1 and Q2 to be partially biased on. Also, current is provided from the +V2 source through the array bias circuit to node C, and to the bit lines through Q5 and Q6 which are on at this time due to the up level of the phase D terminal. Note that at this time the phase B terminal is down keeping transistor Q10 off such that no current flows from the +V1 terminal. Assuming for this example that internal node A is at a relative up level while internal node B is at a logical down level, then Q4 is biased on while Q3 is biased off. Thus, current will flow from bit line B1 through Q2 and Q4 to ground potential. Q3 will be held off and so long as node A remains at an up level that is not exceeded by more than one threshold voltage drop by the potential at node D, Q1 will also remain off. This will maintain the cell in a D.C. stable mode. It is here noted that since Q1 and Q2 are load devices, they may have their impedances (L/W ratios) set to a higher impedance than that of cross-coupled devices Q3 and Q4.

The stand-by bit line voltage, is too low for operating the FET array in the read and write mode. Device 10 is therefore added to permit raising the bit line voltage prior to either a read or write operation. When a particular word line is selected, Q10 is turned on by the phase B timing pulse. The array bias is then isolated from the word lines. Initially, the phase D timing pulse is also maintained in an up level permitting current through device 8 to also charge the bit lines. Upon selection of the particular semiconductor chip into which the illustrated array is formed, all word lines are discharged to ground. The bit line restore devices Q5, Q6, and Q7 are permitted to remain on for some time to equalize the different potential on the bit lines created by the load current of the cell(s). After the bit lines are equalized, the bit line restore devices (Q5, Q6, Q7) are switched off by bringing phase D to a down level and the selected word line is raised to the +V1 potential. Assuming that the word line connected to the illustrated cell including transistors Q1, Q2, Q3, and Q4 is to be selected, the decoder/word line driver will bring the word line to which it is connected to this up level. Devices Q1 and Q2 will be turned fully on providing a differential voltage on bit lines B0 and B1 that is the same relative up and down level as stored on internal nodes A and B. The preamp will accelerate bringing this difference potential to a full logic level. At this point one of a plurality of bit switch signals is applied to a terminal such as BIT 1 or BIT 2, and will gate out the information from the cell. For example, in accessing the cell consisting of transistors Q1, Q2, Q3, and Q4, the BIT 1 switch turns on transistors Q14 and Q15 permitting the differential potential on lines B0 and B1 to be sensed by the sense amplifier. In the alternative if it is desired to alter the information in the cell by writing, then the differential data input is applied to the bit line through transistors Q14 and Q15 setting the cross-coupled transistors Q3 and Q4 into the desired one of the two possible binary states. Note that while one of the word lines is thus accessed, all other word lines are clamped to ground by a down level output from the decoder/word line driver.

The details of the just described timing operations are shown in the waveform diagrams of FIG. 2. These various timing waveforms are generated by field effect transistor circuits formed on the same semiconductor chip with the memory cells. The details of these timing circuits are not shown since it is well known to provide timing waveforms in any sequence with field effect transistors formed on a semiconductor chip.

While the invention has been shown and particularly described with reference to preferred embodiments, it will be understood by those skilled in the art that various changes in form and detail may be made therein without departing from the spirit and scope of the invention.

What is claimed is:

1. An array of semiconductor memory cells formed in a semiconductor substrate each one of said memory cells including four devices, the first and second of the four devices being cross-coupled while the third and fourth devices form loads for the cross coupled pair, said array further comprising:
   a plurality of word lines arranged in parallel with each other each connected to a plurality of said cells arranged in a row;
   a plurality of bit lines, parallel to each other, arranged orthogonally to said word lines, a pair of said bit lines being operatively associated with each cell in a column of cells;
   means for selecting one of said plurality of word lines and a pair of said bit lines;
   means for applying first and second fixed potentials to one row of said cells while simultaneously applying only said second fixed potential to all other cells in said array when said one row of cells is desired to be accessed; and
   means for applying a third potential to all of said cells in said array when none of said cells are desired to be accessed, said third potential being intermediate in value between said first and second fixed potentials.

2. An array of semiconductor memory cells as in claim 1 wherein each one of said four devices comprises:
   a gating electrode and two gated electrodes;
   the first and second of the four devices having their first gated electrodes connected in common while each of their second gated electrodes is connected to the gating electrode of the other of the first and second devices;
   the third device forming a load having its first gated electrode connected to the second gated electrode of the first device;
   the fourth device forming a load having its first gated electrode connected to the second gated electrode of the second device while the gating electrode of the third and fourth devices are connected together.

3. An array of semiconductor memory cells as in claim 2 wherein the gating electrodes of the load devices connected in common are each connected to a word line.

4. An array of semiconductor memory cells as in claim 2 wherein the second gated electrodes of the third and fourth load devices are each connected to first and second ones of a pair of said bit lines.

5. An array of semiconductor memory cells as in claim 2 wherein the first gated electrodes of all the cross coupled cells in the array of memory cells are connected to said second fixed potential, said first fixed potential being applied to the gating electrode of the load devices of the selected cell.

6. An array of semiconductor memory cells as in claim 1 wherein said means for selecting comprises:
   means for rendering said third and fourth load devices fully conductive; and
   means for applying a differential potential to said pair of bit lines.

7. An array of semiconductor memory cells as in claim 6 wherein said means for applying a differential potential to said bit lines comprises:
gating means including first and second field effect transistors connected to said first and second bit lines.

8. An array of semiconductor memory cells as in claim 1 additionally comprising:
restoring means connected between each said pair of said bit lines being operatively associated with each cell in a column of cells.

9. An array of semiconductor memory cells as in claim 1 wherein said means for applying a third potential comprises:
an array bias means having outputs connected to each said plurality of word lines.

10. An array of semiconductor memory cells as in claim 1 additionally comprising:
differential amplifying means connected between each said pair of said bit lines being operatively associated with each cell in a column of cells.

11. An array of semiconductor memory cells formed in a semiconductor substrate each one of said memory cells including four devices, the first and second of the four devices being cross-coupled while the third and fourth devices form loads for the cross-coupled pair, said array further comprising:
a plurality of word lines arranged in parallel with each other each connected to a plurality of said cells arranged in a row;
a plurality of bit lines, parallel to each other, arranged orthogonally to said word lines, a pair of said bit lines being operatively associated with each cell in a column of cells;
means for fully turning on the third and fourth devices forming loads on all cells in a row while turning off all other load devices in the array; and
means for partially turning on all of said load devices in said array when none of said cells are desired to be accessed.

12. An array of semiconductor memory cells as in claim 11 wherein each one of said four devices comprises:
a gating electrode and two gated electrodes;
the first and second of the four devices having their first gated electrodes connected in common while each of their second gated electodes is connected to the gating electrode of the other of the first and second devices;
the third device forming a load having its first gated electrode connected to the second gated electrode of the first device;
the fourth device forming a load having its first gated electrode connected to the second gated electrode of the second device while the gating electrode of the third and fourth devices are connected together.

13. An array of semiconductor memory cells as in claim 12 wherein the gating electrodes of the load devices connected in common are each connected to a word line.

14. An array of semiconductor memory cells as in claim 13 wherein the second gated electrodes of the third and fourth load devices are each connected to first and second ones of a pair of said bit lines.

15. An array of semiconductor memory cells as in claim 13 wherein the first gated electrodes of all the cross coupled cells in the array of memory cells are connected to said second fixed potential, said first fixed potential being applied to the gating electrode of the load devices of the selected cell.

16. An array of semiconductor memory cells as in claim 11 additionally comprising:
restoring means connected between each said pair of said bit lines being operatively associated with each cell in a column of cells.

17. An array of semiconductor memory cells as in claim 11 additionally comprising:
differential amplifying means connected between each said pair of said bit lines being operatively associated with each cell in a column of cells.

18. An array of semiconductor memory cells as in claim 11 wherein said means for partially turning on all of said load devices in said array when none of said cells are desired to be accessed comprises:
an array bias means having outputs connected to each said plurality of word lines.

* * * * *